US008427353B2

(12) United States Patent
Cheng

(10) Patent No.: US 8,427,353 B2
(45) Date of Patent: Apr. 23, 2013

(54) HIGH-SPEED FLASH ANALOG TO DIGITAL CONVERTER

(75) Inventor: Lawrence Chi Fung Cheng, San Jose, CA (US)

(73) Assignee: Credo Semiconductor (Hong Kong) Limited, Hong Kong (HK)

( * ) Notice: Subject to any disclaimer, the term of this patent is extended or adjusted under 35 U.S.C. 154(b) by 139 days.

(21) Appl. No.: 13/027,625

(22) Filed: Feb. 15, 2011

(65) Prior Publication Data

US 2012/0207247 A1    Aug. 16, 2012

(51) Int. Cl.
*H03M 1/36* (2006.01)
(52) U.S. Cl.
USPC .......................................... 341/159; 341/155
(58) Field of Classification Search .................. 341/155, 341/159, 160
See application file for complete search history.

(56) References Cited

U.S. PATENT DOCUMENTS

| | | | | |
|---|---|---|---|---|
| 5,420,587 A | * | 5/1995 | Michel | 341/156 |
| 5,936,566 A | * | 8/1999 | Park | 341/159 |
| 6,002,356 A | * | 12/1999 | Cooper | 341/160 |

OTHER PUBLICATIONS

Pending U.S. Appl. No. 12/565,817, filed Sep. 24, 2009; Inventor: Runsheng He.
Pending U.S. Appl. No. 12/618,735, filed Nov. 15, 2009; Inventor: Runsheng He
Yuriy M. Greshishchev et al., "A 40GS/s 6b ADC in 65nm CMOS", in IEEE International Solid-State Circuits Conference, 2010, pp. 390-392, ISSCC 2010/Session 21/Successive-Approximation ADCs / 21.7, Nortel, Ottawa, Canada.

* cited by examiner

*Primary Examiner* — Brian Young
(74) *Attorney, Agent, or Firm* — Krueger Iselin LLP

(57) ABSTRACT

Disclosed is at least one flash analog-to-digital converter embodiment having a linear voltage ladder, a set of comparators each of which is coupled to one or more operational amplifiers by a sampling switch. Each of the sampling switches samples the comparator output, using the parasitic capacitance of the operational amplifier to hold the voltage. The sampling switches may be single transistors. Some embodiments further include, for each comparator, multiple operational amplifiers each of which drives a binary latch via a gating switch. The gating switches operate in sequence to distribute sequential samples to different latches. At least some embodiments of the flash converter further include an automatic gain control (AGC) that has both differential input terminals and differential output terminals. In such embodiments the comparators compare the differential output of the AGC to a differential reference voltage, and may further provide the result as a differential signal.

20 Claims, 8 Drawing Sheets

HIGH-SPEED FLASH ANALOG TO DIGITAL CONVERTER

BACKGROUND

A computer network is any set of computers coupled to each other with the ability to exchange data. The interconnections between computers enable communication with a variety of different kinds of media, including twisted-pair wires, coaxial cables, fiber optic cables, power lines, Ethernet and various wireless technologies. Faster interconnections generally improve network performance by reducing latency and increasing communication bandwidth. Higher bandwidths enable desirable services such as social media, video conferencing, multi-media transfers, etc. Further, an increased capacity for uploads and downloads can create a huge boost in productivity for any individual or business entity—the speedier the connections, the better the network's utility to its users.

The interconnections (such as fiber optic cables, twisted pair wires, coaxial cables, etc.) carry analog electrical or optical signals between transceivers. The signal may be, for example, an electrical voltage, an electrical current, an optical power level, a wavelength, a frequency, or a phase value. The receiver receives the signal, converts that analog electrical or optical signal into digital format, and extracts the transmitted data stream for use by the receiving node. The analog-to-digital conversion often employs a flash analog to digital converter.

A flash analog to digital converter is a type of fast converter that uses a linear voltage ladder and a comparator at each "step" in the ladder. The comparators operate in parallel to compare the input voltage to each of the reference voltages. Often these ladders are constructed of a series of resistors, but capacitive voltage division is also possible. Though flash converters are extremely fast, they typically require a large number of comparators relative to other analog to digital converter implementations, especially as the precision increases. A flash converter requires $2^n-1$ comparators for an n-bit conversion. The output of these comparators is generally fed into a digital encoder which converts the inputs into a binary value.

The Institute of Electrical and Electronics Engineers (IEEE) has published IEEE Std 802.3ba-2010, a standard which provides for Ethernet communications at rates as high as 100 Gb/s. The standard specifies the signaling rate for individual channels can be as high as 25 Gb/s. Since the fundamental limit for transistor switching in the 65 nm silicon integrated circuit manufacturing process is below 40 Ghz, the new IEEE standard places high demands indeed on the implementation of the analog to digital converter.

BRIEF DESCRIPTION OF THE DRAWINGS

A better understanding of the various disclosed system and method embodiments can be obtained when the following detailed description is considered in conjunction with the drawings, in which.

DETAILED DESCRIPTION

Accordingly, disclosed herein are some embodiments for a high-speed analog to digital converter. In at least one embodiment, a flash analog-to-digital converter includes a linear voltage ladder and a series of comparators, each of which is coupled to at least one operational amplifier by a sampling switch. Each of the sampling switches samples the comparator output, using the parasitic capacitance of the operational amplifier to hold the voltage. The sampling switches may be single transistors. Some embodiments further include, for each comparator, multiple operational amplifiers each of which drives a binary latch via a gating switch. The gating switches operate in sequence to distribute sequential samples to different latches. At least some embodiments of the flash converter further include an automatic gain control (AGC) that has both differential input terminals and differential output terminals. In such embodiments the comparators compare the differential output of the AGC to a differential reference voltage, and may further provide the result as a differential signal. The operational amplifiers may be coupled to a set of latches that hold a the output signal from said operational amplifiers as a digital value.

The flash analog to digital converter may be part of a high-speed digital communication receiver system that includes a transducer and an analog filter. The flash analog to digital converter may provide interleaved sampling so as to provide a demodulator with digitized values for both in-phase and quadrature components of a receive signal.

Figure 1:
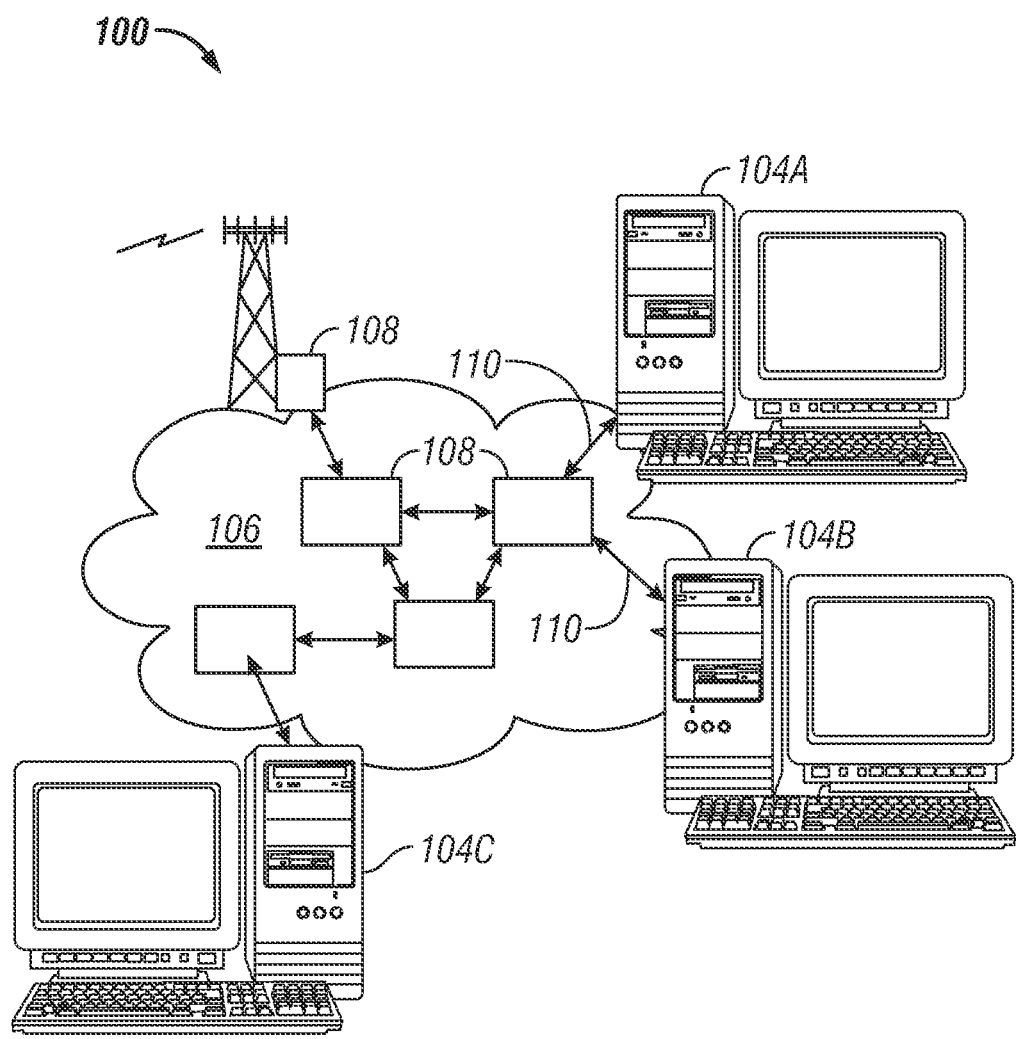
FIG. 1 shows an illustrative computer network.

The disclosed embodiments are best understood in terms of the environment in which they may be expected to operate. Accordingly, FIG. 1 shows an illustrative computer network 100 including computer systems 104A-C coupled to a routing network 106. The routing network 106 may be or include, for example, the Internet, a wide area network, a local area network, wireless networks, and/or portions of the telephone network. In FIG. 1, the routing network 106 includes a network of equipment items 108, such as switches, routers, and the like. The equipment items 108 are connected to one another, and to the computer systems 104A-C, via point-to-point communication links 110 that transport data between the various network components. Today, more and more communication links are being developed with an emphasis on speed. IEEE Std 802.3ba-2010 supports sending Ethernet frames at 40 and 100 gigabits per second, with individual channel signaling rates as high as 25 Gb/s. Previously, the fastest published Ethernet standard provided for a data rate of 10 Gb/s.

Figure 2:
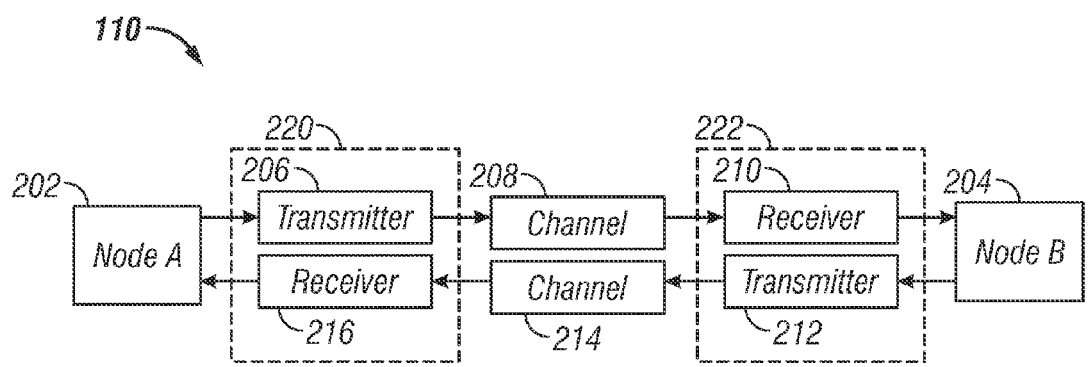
FIG. 2 shows an illustrative point-to-point communication link.

FIG. 2 shows a representative point-to-point communication link 110 of FIG. 1. In the embodiment of FIG. 2, the point-to-point communication link 110 includes a "Node A" 202 at one end, and a "Node B" 204 at an opposite end. Node A may be, for example, one of the equipment items 108 of the computer network 100 of FIG. 1, or one of the computer systems 104A-C. Node B may be, for example, a different one of the equipment items 108, or a different one of the computer systems 104A-C.

Coupled to Node A is a transceiver 220, and coupled to Node B is a transceiver 222. Communication channels 208 and 214 extend between the transceivers 220 and 222. The channels 208 and 214 may include transmission media such as, for example, fiber optic cables, twisted pair wires, coaxial cables, and air (in the case of wireless transmission). Bidirectional communication between Node A and Node B can be provided using separate channels 208 and 214, or in some embodiments, a single channel that transports signals in opposing directions without interference.

A transmitter 206 of the transceiver 220 obtains data from Node A and transmits the data to the transceiver 222 via a signal on the channel 208. The signal may be, for example, an electrical voltage, an electrical current, an optical power level, a wavelength, a frequency, or a phase value. A receiver 210 of the transceiver 222 receives the signal via the channel 208, uses the signal to reconstruct the transmitted data, and provides the data to Node B. Similarly, a transmitter 212 of the transceiver 222 obtains data from Node B and transmits the data to the transceiver 220 via a signal on the channel 214. A receiver 216 of the transceiver 220 receives the signal via the channel 214, uses the signal to reconstruct the transmitted data, and provides the data to Node A.

As stated above, more and more communication links are being developed with an emphasis for speed. More and more, system engineers are turning to fiber optic communication channels to address this demand. While the optical fiber has to support the necessary communications bandwidth, the primary difficulty has been in the design of transmitters and receivers (transceivers) that can support these data rates. Existing systems employ an optical transmitter to convert an electrical signal into an optical signal for transmission over the optical fiber, and an optical receiver to receive fiber optic signals and convert them into electrical data signals. A key component of most existing optical receivers is a photodetector that converts light intensity into a voltage signal.

Figure 3:
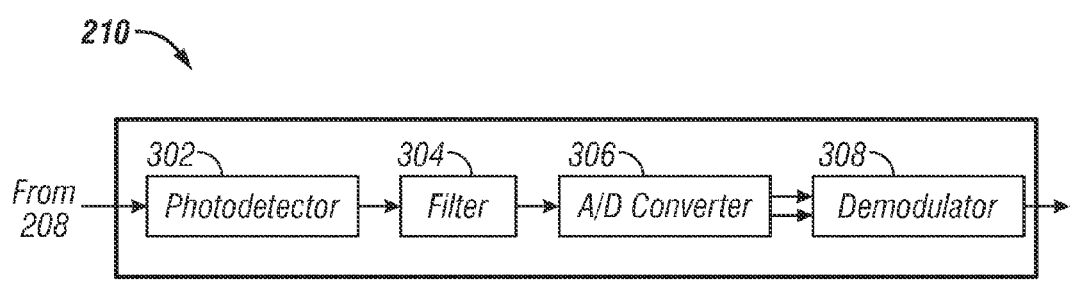
FIG. 3 shows an illustrative receiver.

FIG. 3 shows an illustrative receiver 210 for receiving fiber optic signals. The illustrative receiver 210 includes a photodetector 302, a filter 304, an analog to digital converter 306, and a demodulator 308. The photodetector 302 converts an optical signal into a corresponding electrical signal to be processed by the filter 304, analog to digital converter 306, and demodulator 308. While many suitable photodetectors exist and can be used, most existing systems employ one or more photodiodes or phototransistors that change their conductivity when photons enter the sensitive regions of the device. The filter 304 receives the electrical signal from the photodetector 302 and limits the signal to a frequency band of interest to prevent aliasing during the digitization process. Because the filter 304 is analog, it is generally kept fairly uncomplicated, but this is not a requirement. If desired, filter 304 can be designed to at least partially compensate for characteristics of the channel including spectral responses of the transmitter and photodetector. Alternatively, the filter 304 can be designed to change the spectrum of the received signal to a desired shape such as, e.g., that of a partial response (PR) channel. The analog to digital converter 306 digitizes the filtered signal to provide a stream of digital signal data to the demodulator 308. In some embodiments, the analog to digital converter provides parallel streams of in-phase and quadrature-phase signal data to the demodulator.

Figure 4:
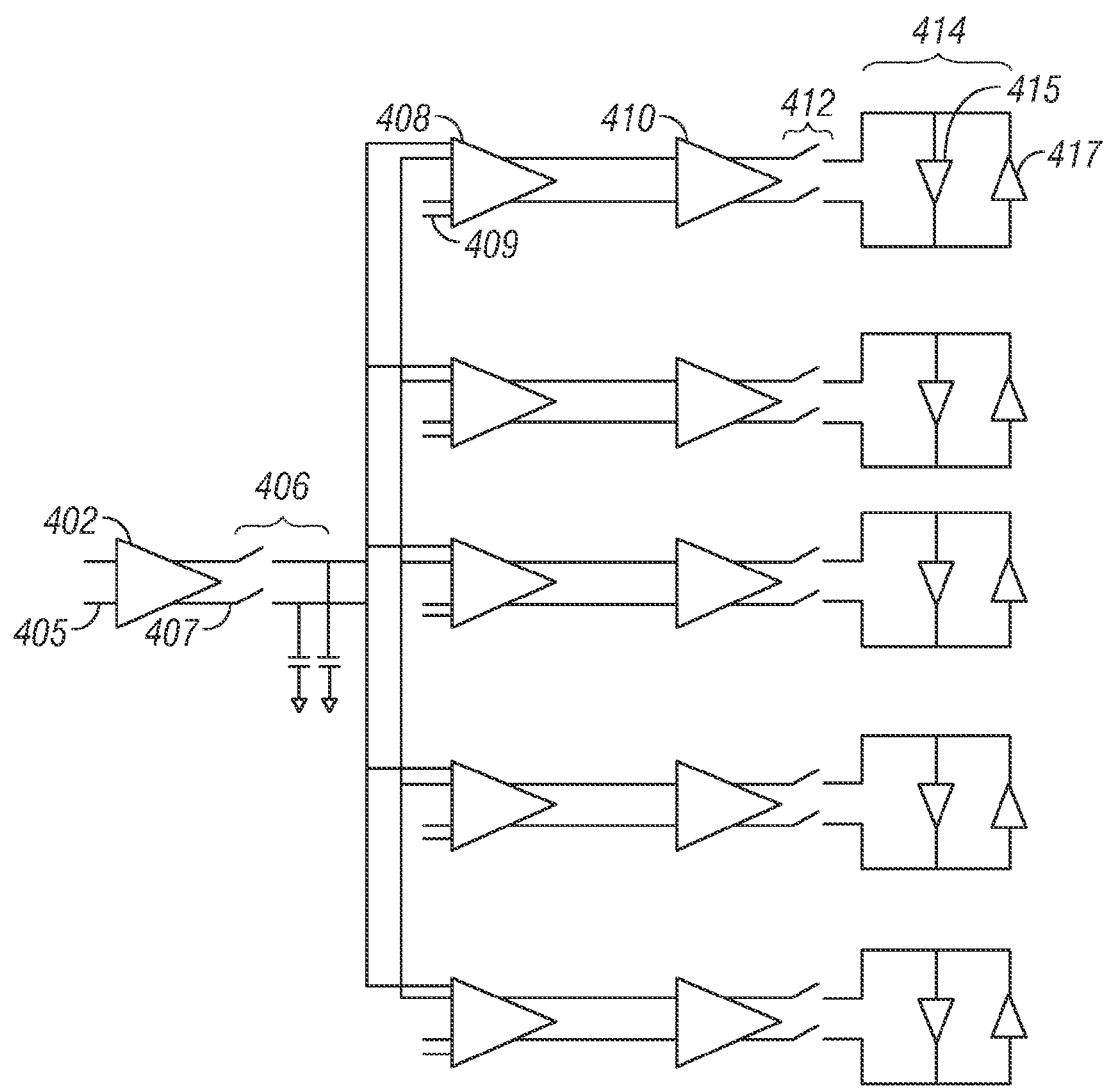
FIG. 4 illustrates a more traditional flash analog-to-digital converter embodiment.

FIG. 4 shows an illustrative embodiment of a first flash analog to digital converter, which includes differential inputs 405 (both positive and negative) to an automatic gain control (AGC) 402 with differential outputs 407. The differential outputs 407 of the AGC 402 are electrically coupled to a sample and hold circuit 406. The AGC 402 is an adaptive system found in many electronic devices to regulate input analog signal levels. Typically, the AGC's average output signal level is monitored and the AGC's gain is adjusted as needed to keep the signal range within the desired limits.

The sample and hold circuit 406 is made up of two switches and two capacitors. When the switches close, the capacitor voltages follow the differential output signals of the AGC, and when they open the capacitors voltages hold steady (except for losses due to charge leakage). The capacitors are coupled to the differential inputs of each of a series of comparators 408. Each comparator compares the differential input voltage to a differential reference voltage 409 from a voltage ladder and provides a digital high or low signal to indicate whether the input voltage is above or below the differential reference voltage.

It is desired to latch the digital outputs of the comparators until they can be converted into a binary value. Latches 414 are provided for this purpose and they can take the form of two nose-to-tail inverters 415 and 417 that operate to maintain the digital value that is impressed on them. To avoid unduly loading the comparators (and thereby reducing their slew rate), a set of operational amplifiers 410 are electrically coupled comparators 408 to drive the latches 414 in accordance with the comparator outputs. If desired, a series of gating switches 412 may be located between the series of operational amplifiers 410 and the series of latches 414 to ensure that the latch states are locked in while the comparators operate on subsequent signal values. In some embodiments (discussed further below with respect to FIG. 7 et seq), additional sets of gating switches 412 may be used to provide access to additional sets of latches 414 to provide for parallel processing of sequential signal values.

As discussed above, an important feature in networking and communication systems is speed. Because of the use of analog to digital converters with optical transceivers and high-speed Ethernet modules, speed from an analog to digital converter is important for communication speed and data exchange. Existing flash analog to digital converters may experience difficulty in operating above 20 giga-samples per second due to the fundamental switching limits encountered in silicon.

Figure 5:
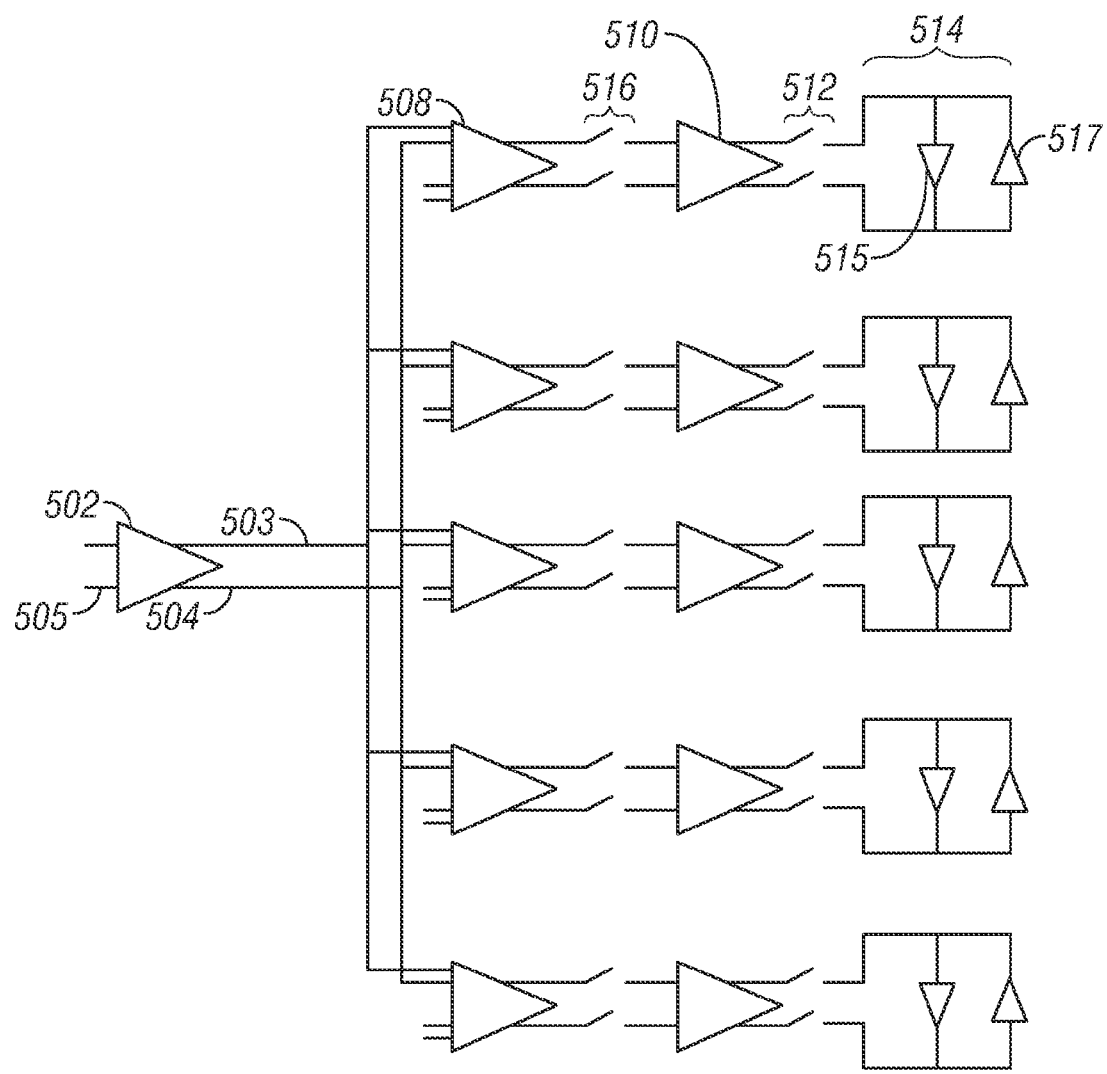
FIG. 5 illustrates an improved flash analog-to-digital converter embodiment.

Accordingly, FIG. 5 shows an improved flash analog to digital converter embodiment. As with the embodiment of FIG. 4, FIG. 5 provides an automatic gain control 502, a series of comparators 508, a series of operational amplifiers 510, a series of gating switches 512, and a series of latches 514 (each latch made up of two nose-to-tail inverters 515 and 517). However, the sample-and-hold 406 that preceded the comparators has been replaced with a series of sampling switches 516 that follow the comparators 508. The sampling switches are single NMOS (negative channel metal oxide semiconductor) transistors. Though this relocation of the sampling switches substantially increases the number of sampling switches, it may offer a substantial advantage. Since the sampled value is at the output of the comparator, it is a digital value, meaning that a higher degree of leakage current can be tolerated than if it were an analog value being sampled. This observation enables the necessary "hold" capacitance to be lowered to such a degree that parasitic capacitances of the input terminals on the operational amplifiers 510 will suffice. Moreover, the elimination of the hold capacitors from the output of the AGC and lack of discrete capacitors in the analog-to-digital converter switching paths enables a vast improvement in circuit bandwidth, enabling the AGC outputs and comparator outputs to slew and switch much more quickly and to operate nearer the fundamental switching limits of the silicon.

Figure 6A:
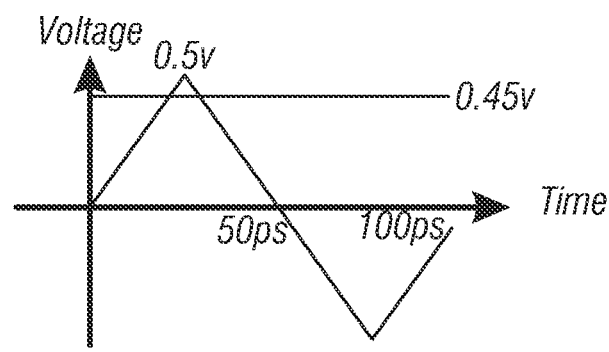
FIG. 6A-D show illustrative signals for the circuit of FIG. 5.
Figure 6B:
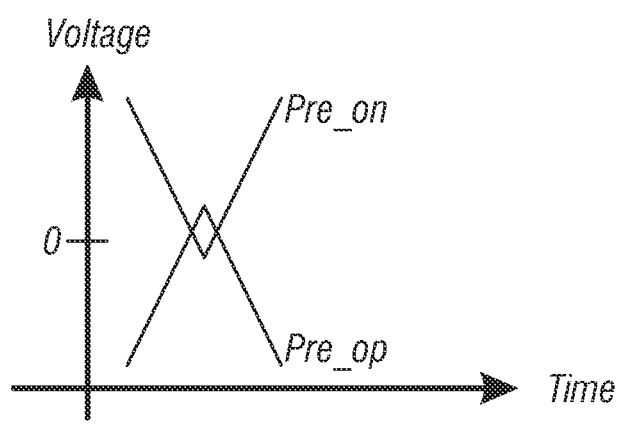
Figure 6C:
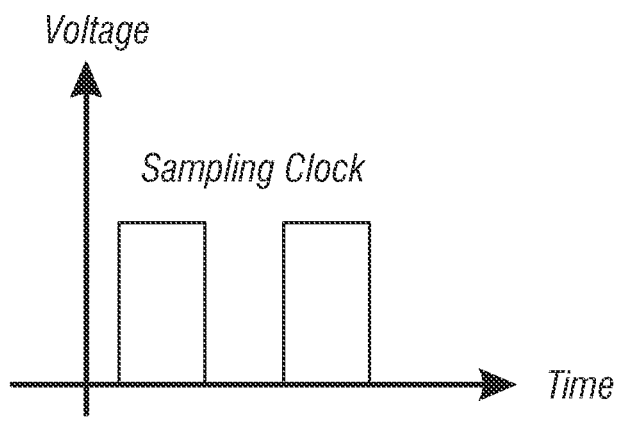
Figure 6D:
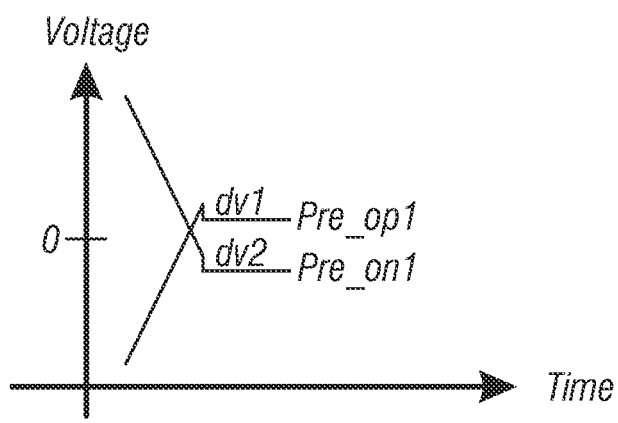

FIGS. 6A-D provide an illustrative timing chart for the analog-to-digital converter embodiment in FIG. 5. FIG. 6A shows a triangular waveform output from the automatic gain control 502 which goes momentarily above a comparator threshold 0.48 v for less than about 10 ps. FIG. 6B shows the corresponding waveforms on the differential output of the comparator (Pre_op being the positive and Pre_on being the negative side of the differential signal). Note that the differential signals cross as the input voltage exceeds the threshold. Because the output load is small, the output signals track the input signal quite closely. FIG. 6C shows an illustrative clock waveform that might be supplied to sampling switches 516, with the switches being closed during the high portion of the clock cycle and open during the low portion of the clock cycle. The signals passed by the switches would then be expected to resemble those illustrated in FIG. 6D. While the switches are closed, the switch outputs dv1 and dv2 follow the comparator outputs Pre_op and Pre_on, respectively. When the switches open, the comparator outputs are held (aside from a level shift that is shared by both output signals with the result that the differential signal is maintained) until the sampling switch is again closed. It is expected that at the contemplated sampling rates, any decay of the sampled value while the switches are open will be negligible. Thus the embodiment of FIG. 5 provides for faithful capture of the input signal even at very high frequencies (e.g., at sample rates near 25 GHz in CMOS silicon device having a 65 nm feature size).

Figure 7:
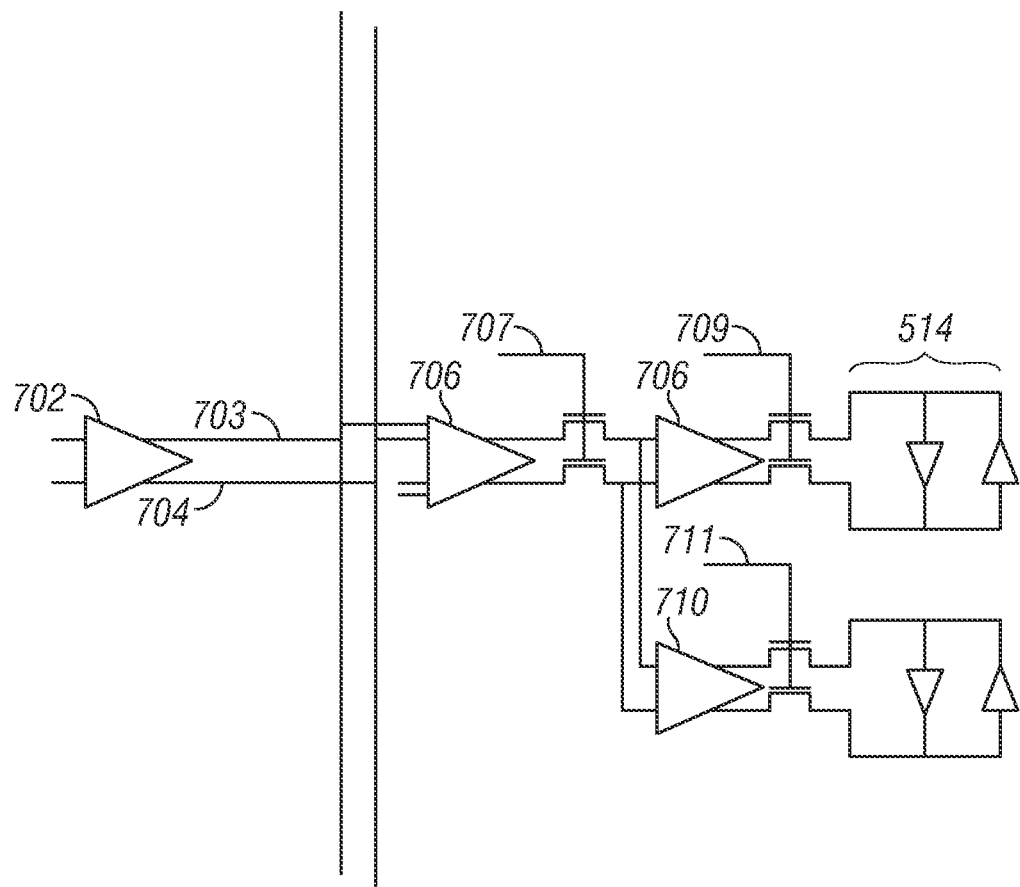
FIG. 7 illustrates an alternate sampling mechanism for the circuit of FIG. 5.
Figure 8A:
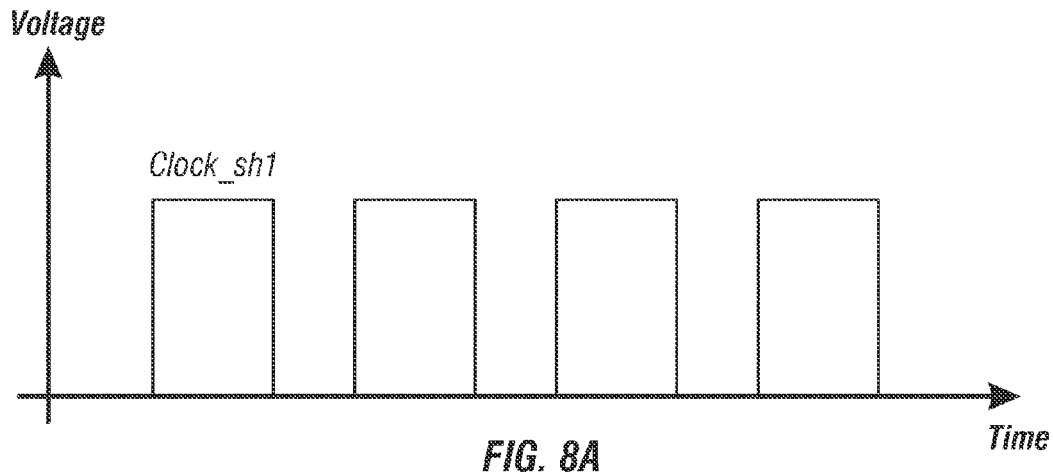
FIG. 8A-C shows illustrative clock signals for the mechanism of FIG. 7.
Figure 8B:
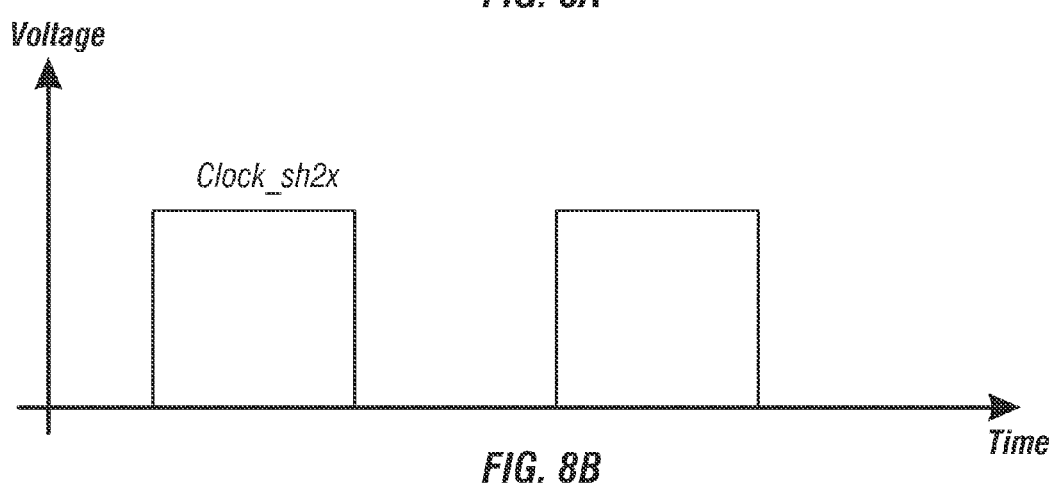
Figure 8C:
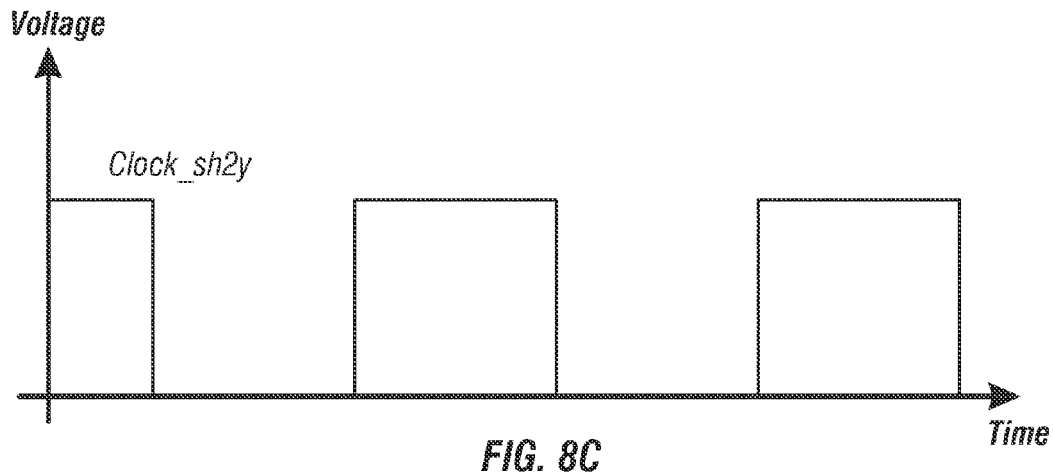

FIG. 7 shows a detail view of a circuit having multiple latches for each comparator to provide sequential samples in parallel. This alternate sampling circuit can, for example, be employed with the converter architecture illustrated in FIG. 5. The AGC 702 supplies differential signals 703 and 704 to each of the comparators 706 in a set that employs a voltage ladder to provide a sequence of reference voltages for comparison. The comparator output signals are sampled in response to clock signal 707. The sampling switches are individual transistors that are on for part of the clock cycle and off (open) for the remainder of the clock. The outputs of the sampling switches are a differential signal that is amplified by operational amplifiers 706 and 710. The gating switches operate alternately in response to clock signals 709 and 711, which cycle at half of the rate of clock signal 707. FIG. 8 illustrates the relationship between the clock signals 707, 709 and 711. FIG. 8A shows the clock signal 707 for the sampling switches, while FIG. 8B shows the clock signal 709 for the first set of gating switches and FIG. 8C shows the clock signal 711 for the second set of gating switches. Note that clock signals 709 and 711 are 180° out of phase to provide for alternate gating of the latches, and they operate at half the original clock rate to enable time for the latches to be set.

It is contemplated that the illustrated latches will drive logic gates that convert the "thermometer"-style digital representation into a standard binary number representation of the digitized signal values. (Such digital logic is well known and can be found in standard digital design textbooks.) These digital values can then be provided to a digital equalizer and/or demodulator suitable for the channel and signal modulation scheme. Where channel coding and framing is employed, the demodulator may further provide synchronization and decoding functionality. At least some of the analog to digital converter embodiments provide parallel streams of digital values to the subsequent receiver stages. In some cases these parallel streams represent the in-phase and quadrature phase signal components. Such parallel streams may also or alternatively represent serial samples that are presented for parallel processing by the digital receiver stages. Though FIG. 7 shows only two latches per comparator, some embodiments may employ four or more latches (with corresponding gating switches) for each comparator output.

The voltage ladders employed to generate reference voltages are expected to be linear voltage ladders, though other types of ladders can be employed if desired (e.g., for logarithmic representations). The ladders can be based on resistive, capacitive or other circuit elements. Though it is anticipated that the parasitic capacitance of the operational amplifier inputs is sufficient to serve as the "hold" capacitance for the sampling switches, some embodiments may employ discrete capacitive elements so long as the comparators are not loaded to such an extent that their slew rates would prevent accurate tracking of the input signal. These and other variations and modifications will become apparent to those skilled in the art once the above disclosure is fully appreciated. It is intended that the following claims be interpreted to embrace all such variations and modifications.

What is claimed is:

1. A flash analog to digital converter that comprises:
   a set of comparators that compare reference voltages to an unsampled analog input signal;
   a set of sampling switches each coupled to an associated one of said comparators to sample that comparator's output signal; and
   a set of operational amplifiers each coupled to receive a sampled comparator output from an associated one of said switches, wherein each operational amplifier provides a binary signal representing a digital sample of the unsampled analog input signal.

2. The flash analog to digital converter of claim 1, further comprising: an automatic gain control electrically coupled to said set of comparators without an intermediate sample and hold circuit.

3. The flash analog to digital converter of claim 2, wherein said automatic gain control has differential input terminals and differential output terminals.

4. The flash analog to digital converter of claim 1, wherein each of said operational amplifiers provides its binary signal to a corresponding latch via a gating switch.

5. The flash analog to digital converter of claim 4, wherein said set of operational amplifiers includes at least two operational amplifiers coupled to each comparator.

6. The flash analog to digital converter of claim 5, wherein said gating switches operate in alternation to drive alternate binary signal values onto said latches.

7. The flash analog to digital converter of claim 5, wherein each of said operational amplifiers provides a differential signal to two gating switches.

8. The flash analog to digital converter of claim 1, wherein each of said sampling switches is a single transistor.

9. The flash analog to digital converter of claim 8, wherein each of said comparators provides a differential output to two sampling switches.

10. An analog-to-digital conversion method that comprises:
    using a set of comparators to compare an unsampled analog input signal to each of a set of reference voltages;
    sampling outputs of said set of comparators to provide sampled comparator outputs to a set of operational amplifiers; and
    converting said sampled comparator outputs to a stream of binary values representing digital samples of the unsampled analog input signal.

11. The method of claim 10, further comprising deriving said unsampled analog signal from an optical signal.

12. The method of claim 11, wherein said deriving includes sensing the optical signal with a photodetector to obtain a receive signal and applying an anti-aliasing filter to the receive signal.

13. The method of claim 10, wherein the unsampled analog input signal is supplied to the set of comparators by an automatic gain control amplifier.

14. The method of claim 10, wherein said converting includes: employing said set of operational amplifiers to drive the sampled comparator outputs onto a set of binary latches.

15. The method of claim 10, wherein said converting includes: gating said sampled comparator outputs onto a selected one of multiple sets of binary latches, wherein the selected one of said multiple sets changes with each sample.

16. A high-speed digital communication receiver that comprises:
 an anti-aliasing filter;
 a flash analog to digital converter coupled to the filter to receive an analog input signal, the converter comprising a set of comparators, each comparator comparing the analog input signal to a respective reference voltage to provide a comparator output signal that is coupled to multiple operational amplifiers via a sampling switch, said operational amplifiers each driving binary latches via gating switches that close in sequence to direct sequential sampled outputs to different latches; and
 a demodulator that reconstructs a transmitted data stream based on at least one stream of digital samples provided by the flash analog to digital converter.

17. The receiver of claim 16, wherein the flash analog to digital converter provides at least one stream of digital samples representing an in-phase receive signal component and at least one other stream of digital samples representing a quadrature-phase receive signal component.

18. The receiver of claim 16, further comprising at least one photodetector that receives an optical signal and provides a corresponding electrical signal to the anti-aliasing filter.

19. The receiver of claim 16, further comprising an automatic gain control amplifier that maintains the analog input signal within a predetermined range.

20. The receiver of claim 16, wherein the flash analog to digital converter lacks a discrete capacitive element to hold sampled comparator output signals.

* * * * *